United States Patent [19]

Michener

[11] Patent Number: 4,861,991

[45] Date of Patent: Aug. 29, 1989

[54] ELECTRON STORAGE SOURCE FOR ELECTRON BEAM TESTERS

[75] Inventor: John R. Michener, Princeton, N.J.

[73] Assignee: Siemens Corporate Research & Support, Inc., Iselin, N.J.

[21] Appl. No.: 252,286

[22] Filed: Sep. 30, 1988

[51] Int. Cl.[4] .................................... H01T 37/00
[52] U.S. Cl. ............................ 250/310; 250/305; 250/306; 250/423 R; 250/396 R
[58] Field of Search ............. 250/310, 49.2 Z, 423 R, 250/424, 427, 396 R, 306, 291, 305; 328/233, 234

[56] References Cited

U.S. PATENT DOCUMENTS

| 2,531,384 | 11/1950 | Bailey | 328/234 |
| 3,398,308 | 8/1968 | Steimel | 328/234 |
| 3,879,679 | 4/1975 | Mourier | 328/233 |
| 4,193,003 | 3/1980 | Blanchard et al. | 437/170 |
| 4,639,634 | 1/1989 | Meyrand | 328/234 |
| 4,740,973 | 4/1988 | Madey et al. | 372/2 |

Primary Examiner—Carolyn E. Fields
Assistant Examiner—John A. Miller
Attorney, Agent, or Firm—John Francis Moran

[57] ABSTRACT

An electron beam tester (11) utilizes a source (13) of stored electrons to produce a probing beam (14) of short pulses and high intensity. The high intensity improves the signal-to-noise ratio of the potential being measured and is especially suited for measuring potentials in high speed integrated circuits (19) while they are operating. The cyclotron principle is adapted for storing the electrons in an orbital configuration wherein the electrons are clustered in bunches having substantially the same energy level. These characteristics of the electrons in a beam facilitate its operation and control in an electron beam tester for contactless monitoring of voltage potentials in an operating high speed integrated circuit.

7 Claims, 2 Drawing Sheets

ELECTRON STORAGE SOURCE FOR ELECTRON BEAM TESTERS

BACKGROUND OF THE INVENTION

This invention relates to techniques for the contactless measurement using an electron (E) beam and it relates, more particularly, to an electron source for electron beam testers.

Electron beam testers typically operate at very low duty cycles wherein the electron beam is on for a very small fraction of the time that the circuit under test is being inspected. In such a case, the signal-to-noise ratio of electron beam testers is a function of the number of electrons collected. Hence, this is related to the total number of electrons that strike the point being inspected. The number of electrons is dependent upon the electron beam current of the column of electrons. For a conventional LaB$_6$ source, the electron beam would typically have a very low current of about 1 nanoampere. Field emission sources produce currents several times larger.

For high speed circuits to be examined, it is necessary for the electron pulses to be very short. This allows observation of fast waveforms. In this situation, the output of the electron beam tester is the convolution of the electron beam pulse with the waveform under observation. When a one hundred picosecond pulse occurs in an electron beam current of one nanoampere, each electron pulse only contains on the order of one or two electrons. Such electron pulses have extremely low signal-to-noise ratios and require very long integration times to yield useable signals.

It is an object of the present invention to provide some form of electron storage to produce a significant increase in the effective beam current suitable for the combination of low duty cycles in pulses of short duration.

SUMMARY OF THE INVENTION

An object of the invention is to provide an electron source for enhancing the performance of electron beam testers.

The invention utilizes an electron source wherein electrons are stored in orbit for delivery in short bursts of relatively high intensity for improving signal-to-noise ratio performance in measuring voltage potentials. In an actual monitoring situation, the characteristics of the electron beam make it more suitable for measuring potentials which themselves are sustained only briefly which is typical in the operation of high speed integrated circuits.

In some of the further aspects of the invention, the electrons orbit in a magnetic field whose magnetic field intensity changes radially so as to contain electrons in bunches having the same energy level. An electrode configuration provides a plurality of gaps wherein an electric field is developed to achieve the energy level of electrons clustered into bunches. An extractor electrode located along the orbital path releases the electrons in a burst tangentially directed from the orbit for control by the electron beam tester. The electric fields are produced dynamically by the potential differences of a radio frequency generator operating at a frequency related to the orbital speed of the electrons. The occurrence of a potential at the extractor electrode is synchronized to position of an orbital cluster of electrons.

BRIEF DESCRIPTION OF THE DRAWING

Features of the invention and additional objects of the invention will be more readily appreciated and better understood by reference to the following detailed description which should be considered in conjunction with the drawing.

DETAILED DESCRIPTION

Figure 1:
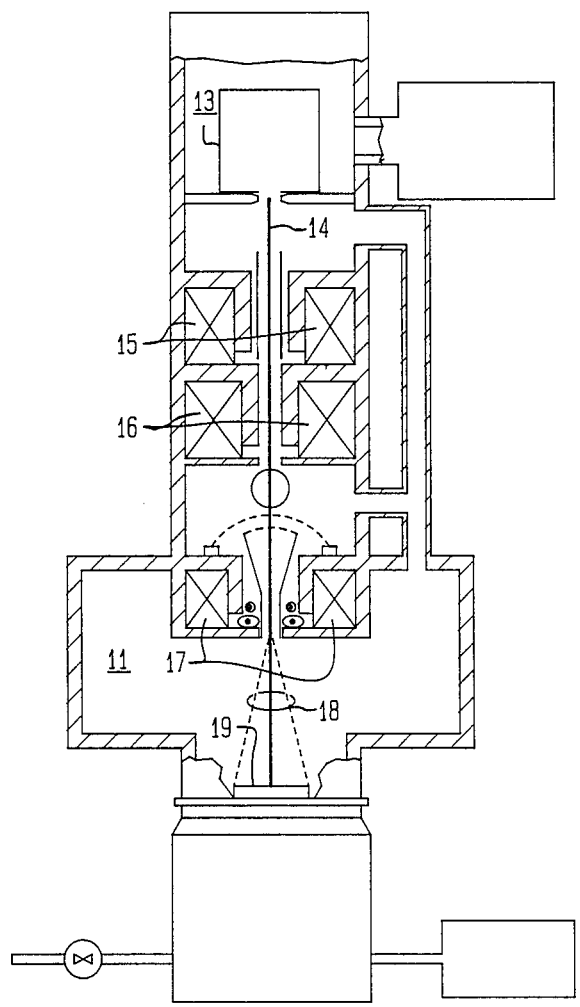
FIG. 1 illustrates an overall view of a typical electron beam tester which may also be referred to as an electron microscope.

FIG. 1 depicts a scanning electron microscope system 11 including an electron source 13 understood to hone a keying electrode (not shown) which controls the occurrence of the electron beam also referred to as E beam 14. The electron source 13, in this case, has the capability of internally storing electrons so that a relatively large amount of electrons in a short burst correspond to a short pulse. This characteristic increases the signal-to-noise ratio of the voltage potential being measured at the point of impact for the E-beam and is consistent with the very low duty cycle of traditional electron beam testers. Such an arrangement is particularly advantageous for determining potentials in high speed integrated circuits.

The geometry of the E-beam is controlled by a electromagnetic lens system which first includes an immersion condensor lens system 15 and then an immersion spectrometer objective lens 16. After the electron beam is collimated, it is deflected by deflection system 17 over a span 18 directed to various measuring points on wafer 19 which comprises one or more integrated circuits being evaluated by the E-beam system 11. In accordance with the usual technique of determining potentials at the point of impingement by the E-beam, secondary emission electrons are collected. Also other standard techniques of determining potentials at selected points corresponding to the aim of the E-beam may be readily used. Although not shown, it is to be understood that control circuitry of conventional design is used to provide operation of the electron beam system 11.

Figure 2:
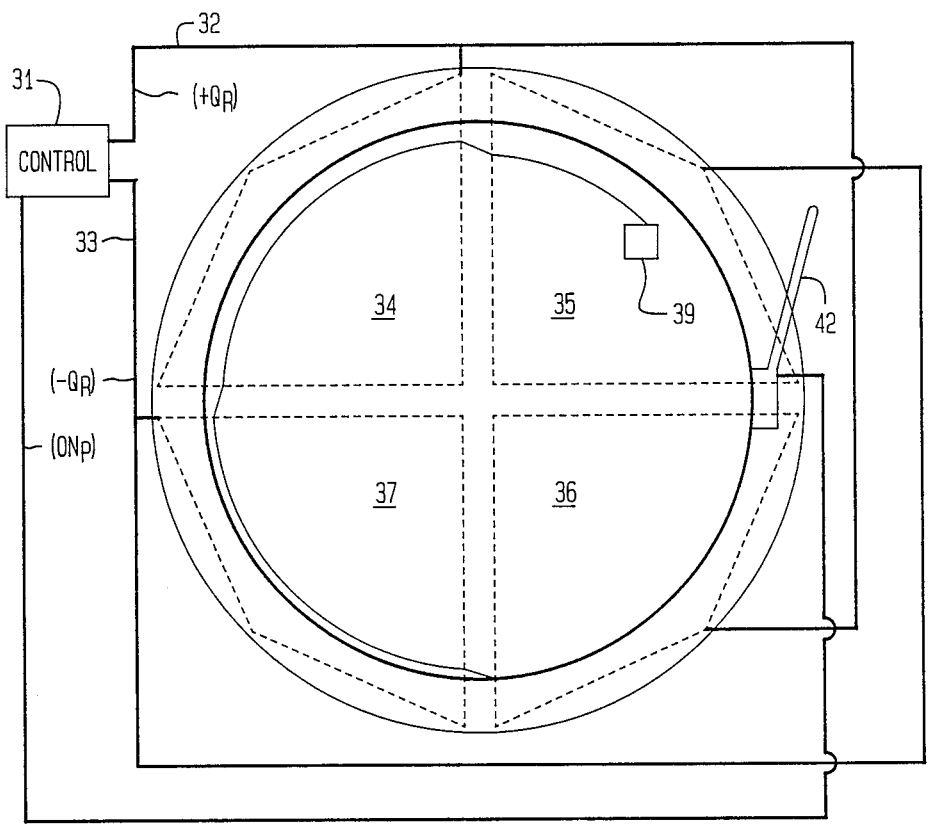
FIG. 2 and 3 depict different views of a storage electron source for producing a relatively intense electron beam in short bursts.
Figure 3:
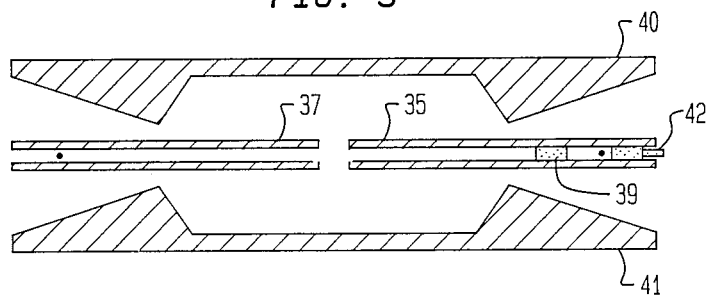
Figure 4:
FIG. 4 is a graphical representation of the magnetic field strength in relation to an increase of orbital radius of the electrons being stored in the device of FIGS. 2 and 3.

FIGS. 2 and 3 illustrate the construction of the electron source 13 of FIG. 1 which has a capability of storing a quantity of electrons which are delivered as short bursts in the electron beam measuring system of FIG. 1. Control 31 generates a radio frequency voltage applied via conductors 32 and 33 to elements 34–37. The electron source comprises a center electrode divided into four quadrature elements 34–37. The space between the parallel plates of each of elements 34–37 is hollow. An electron source 39 such as LaB$_6$, emits electrons which take on a circular orbit in accordance with the frequency of the RF generator of control 31. The circular orbit of the electrons is contained by the magnetic field produced between magnetic polepieces 40 and 41. Specifically, the outer circumference of the electron orbit has a magnetic field strength distribution in accordance with FIG. 4. The triangularly shaped cross sections of magnetic polepieces depicted in FIG. 3 produces the magnetic distribution characteristic of FIG. 4 which contains the radius of the orbiting electrons. Control 31 produces a high voltage pulse, $ON_p$, applied to electron extractor 42 for emission of the electron beam 14. In this case, the beam is directed tangentially from its orbit.

For non-relativistic electons (electrons with energies of <200 KeV may be viewed as being somewhat relativistic, v~0.7c, resulting in a ~20% relativistic correction to the masses of the electron at 200 KeV (a typical electron beam testor operates at a few KeV), the orbital frequency in an uniform magnetic field is constant and is not dependent upon the energy of the electron. Hence if electrons are introduced into a uniform magnetic field and accelerated with an electric field that is synchronized with the orbital frequency of the electron, the electron will be accelerated. As the electron is accelerated its orbital radius will increase, but the orbital frequency will stay constant. Then, the electron radius will expand out of the field of the magnet or the relativistic increase in the mass of the electron will cause the electron to lose synchronism with the accelerating field and stop being accelerated.

Unfortunately, a uniform magnetic field provides no confinement whatsoever for velocity components along the field lines. The electron spirals along the field lines with a constant velocity parallel to the magnetic field. This is not suitable for any practical structure that could be built, because electrons always have some energy, even if it may be small, parallel to the field lines. It is therefore necessary to use a field configuration that traps electrons that have small energies parallel to the magnetic field lines.

If the magnetic field strength increases as the distance along the field line from the orbital plane increases, which implies that for any given value of radius the magnetic field is a minimum along the orbital plane, electrons will be trapped in the orbital plane. The use of shaped pole pieces so that the field strength decreases gradually as the radius increases and the use of an axial minimum field strength at the orbital plane results in confinement of electrons to the plane. The radial decrease in the magnetic field strength means that there is a maximum energy level for acceleration of the accelerate particles by the electron gun. If electrons acquire too much energy they will increase their radius to a region with a lower magnetic field and a lower orbital frequency. They will then drop out of phase with the accelerating potential and be deaccelerated to the design energy of the machine.

After the orbital electrons are extracted to produce an electron pulse in a beam is deflected by a set of deflection electrodes. The beam would be extracted, run through an aperture to define its shape, possibly run through a magnetic field bending magnet and aperture to reject electrons with improper energies, and focused into the column of an electron column. The beam would be deaccelerated during its travel thrugh the electron column to the desired final energy.

Unlike the case of particle accelerators, numerous electron sources could be used to simultaneously inject electrons into the cyclotron storage unit. Since the energy that the electrons would be stored at is relatively low, the electrons could be accelerated by electrostatic fields, and the storage unit would store the electrons as they are elevated to a given level of electron energies. The electron sources could be driven synchronously (with the appropriate phase delays for transit time effects) with the accelerating field so that the electrons are bunched into groups at the appropriate times.

The basic physics of a cyclotron will now be considered. Electrons orbit in a magnetic field of strenth $B_z$ with a angular frequence=$qB_z/m_3$ c (gaussian cgs units). For a field of 100 gauss the resulting orbital frequency is ~280 Mhz. If E is the electron energy, the orbital radius is given by $r=(c/qB_z * (2E me)^{\frac{1}{2}}$. For a 1 Kev electron in a 100 gauss field, r=1.07 cm. A 25 Kev electron would have an orbital radius of 5.35 cm.

Electrons orbiting in an uniform magnetic field are subject to no confinement in the axial direction and have an orbital frequency that is independent of energy in the non-relativistic limit ( the relativistic mass increases as the velocity approaches the speed of light, c, causes the energetic electrons to change their orbital frequency). A radial variation in the axial magnetic field strength allows the confinement of the electrons to a plane perpendicular to the magnetic field. The term that is used to define this variation is the "field index", n where $n = -r/_B dB/_{dr}$. The electrons are confined in both the axial and radial directions as long as $0 < n < 1$. A cyclotron with such a magnetic field structure and accelerating electrodes has a stable orbit for electrons of a specific energy. The orbital frequency in such a structure is a function of the orbital radius, and hence of the energy of the electron. Electrons with less energy than the stable orbit are accelerated to the stable energy. Electrons with to high an energy level are deaccelerated.

The existence of the stable radius allows the incorporation of one or more electron sources into the storage unit. By mounting the electron source within the stable orbit and injecting electrons with almost the stable energy, it is possible to cause the electrons to gain enough energy going through the acceleration electrodes to miss the electrons injectors on their next orbit (due to the radius increase as the electron energy increases). Such a technique is quite similar to what is done in particle accelerators for nuclear physics research. In research applications, the particle beam is extracted shortly before the limiting energy is reached. For an E-beam tester, there is no interest in acceleration to very high energies but the objective is primarily to use the device as a storage unit of relatively low energy electrons. Accordingly, it is desired to use it at the stable energy level.

Now the beam of such unit is not a DC beam. Due to the oscillating nature of the RF fields applied to the acceleration electrodes, the beam current will tend to resemble a rectified AC waveform. By appropriately selecting the electron energy and magnetic field strength, it would not be difficult to arrange that the cyclotron frequency is an integer multiple of the device strobing frequency required by the device under test. This allows electrostatic beam extractor 42 to extract electrons when the beam is at its greatest intensity.

The use of such an electron storage unit will have substantial benefical effects upon the design of the electron column. The output beam of such a storage unit can have quite low angular divergences, allowing the ready focusing of the beam to quite small spot sizes. Such a unit might well use electrostatic deflection of the output beam followed by focusing of the beam by a final lens set upon the device under investigation.

There has thus been shown and described a novel electron beam tester which fulfills all the objects and advantages sought therefor. Many changes, modifications, variations and other uses and applications of the subject invention will, however, become apparent to those skilled in the art after considering this specification and the accompanying drawing which disclose the preferred embodiments thereof. For example, the principle of storing electrons in an orbit may be readily utilized in a device that has different physical characteristics from those illustrated in FIGS. 2 and 3. All such changes, modifications, variations and other uses and applications which do not depart from the spirit and scope of the invention are deemed to be covered by the invention which is limited only by the claims which follow.

I claim:

1. An apparatus for contactless measurement of voltage potentials having a keyed primary electron beam impinging on an electronic component, the apparatus comprising:
   (a) an electron gun comprising means for storing electrons in an orbital path, the electron gun having an electron extractor electrode positioned at a point in the orbital path for tangentially extracting the stored electrons to produce the keyed primary electron beam;
   (b) means for aiming the keyed primary electron beam at an operative electronic component and means for determining voltage potentials at selected points on said component for contactless measurement.

2. The apparatus of claim 1, wherein the electron gun comprises means for producing a magnetic field having a field strength decreasing in strength along the radius of the orbital path.

3. The apparatus of claim 2, wherein the electron gun comprises a plurality of accelerating electrodes collectively enclosing the orbital path while forming a plurality of gaps between the electrodes, a radio frequency potential source connected to develop electric fields across the gaps for accelerating electrons along the orbital path, and at least one of the accelerating electrodes including an electron source for emitting electrons that are stored in the orbital path, the radio frequency source producing clusters of electrons in the orbital path.

4. The apparatus of claim 3, further comprising pulsing means for keying the primary electron beam having its output connected to the electron extractor electrode and operating in response to the radio frequency potential source to produce output pulses coincident with the occurrence of electron clusters in the orbital path.

5. An arrangement for the contactless measurement of a voltage potential in an electronic component with a keyed primary electron beam, the arrangement comprising:
   (a) a scanning electron microscope equipped with a keying device and a deflection system for the primary electron beam;
   (b) a source of electrons for the primary electron beam comprising at least one electron emissive source, a magnetic filed having a selected magnetic gradient along a circular path, at least two planar shaped partially circular disk electrodes in the magnetic field oriented to enclose the circular path, a radio frequency generator having at least two terminals each of which is connected to at least one of the two planar semicircular electrodes, the generator having a keying pulser connected to an electron extractor for producing short bursts in the electron beam;
   (c) wherein means are provided for impinging the electron beam on an operative electronic component at selected point for contactless measurement of voltage potentials at the selected points.

6. The arrangement of claim 5, wherein the number of circular disk electrodes comprises four electrodes.

7. The arrangement of claim 6, wherein a plurality of electron emissive sources corresponds to the number of electrodes.

* * * * *